(12) United States Patent
Koppassery et al.

(10) Patent No.: US 12,418,269 B2
(45) Date of Patent: Sep. 16, 2025

(54) CIRCUIT AND METHOD FOR BIASING AN AMPLIFIER

(71) Applicant: QUALCOMM INCORPORATED, San Diego, CA (US)

(72) Inventors: Girish Koppassery, Bangalore (IN); Amjath Husain, Bangalore (IN); Abhay Shankar Gaikwad, Satara (IN); Samiran Dasgupta, Bangalore (IN); Madhukar Vallabhaneni, Bengaluru (IN)

(73) Assignee: QUALCOMM Incorporated, San Diego, CA (US)

( * ) Notice: Subject to any disclaimer, the term of this patent is extended or adjusted under 35 U.S.C. 154(b) by 515 days.

(21) Appl. No.: 17/972,177

(22) Filed: Oct. 24, 2022

(65) Prior Publication Data

US 2023/0129287 A1   Apr. 27, 2023

Related U.S. Application Data

(60) Provisional application No. 63/271,966, filed on Oct. 26, 2021.

(51) Int. Cl.
*H03F 1/22* (2006.01)
*H03F 3/45* (2006.01)

(52) U.S. Cl.
CPC ... *H03F 3/45475* (2013.01); *H03F 2200/294* (2013.01); *H03F 2200/451* (2013.01)

(58) Field of Classification Search
CPC .... H03F 1/22; H03F 1/30; H03F 3/20; H03G 3/30
USPC ......................................... 330/311, 296, 285
See application file for complete search history.

(56) References Cited

U.S. PATENT DOCUMENTS

| 10,020,782 B2 | 7/2018 | Cohen et al. |
| 2009/0108939 A1 | 4/2009 | Oishi |
| 2020/0036341 A1 | 1/2020 | Klaren et al. |
| 2021/0075377 A1 | 3/2021 | Pal et al. |

OTHER PUBLICATIONS

International Search Report and Written Opinion—PCT/US2022/047633—ISA/EPO—Feb. 3, 2023.

*Primary Examiner* — Henry Choe
(74) *Attorney, Agent, or Firm* — Smith Tempel Blaha LLC/Qualcomm Incorporated (57) ABSTRACT

An amplifier circuit includes an amplifier core having a cascode transistor and a gain transistor, a bias circuit coupled to the amplifier core, the bias circuit comprising: a first current source, a second current source, an operational transconductance amplifier (OTA), a bias cascode transistor pair having a bias cascode transistor and a bias gain transistor, and a replica circuit coupled to the first current source and to the second current source.

14 Claims, 7 Drawing Sheets

(12) United States Patent

CIRCUIT AND METHOD FOR BIASING AN AMPLIFIER

RELATED APPLICATIONS

This application claims priority to and the benefit of U.S. Provisional Patent Application No. 63/271,966, entitled "CIRCUIT AND METHOD FOR BIASING AN AMPLIFIER," filed Oct. 26, 2021, the contents of which are hereby incorporated herein by reference in their entirety as if fully set forth below and for all applicable purposes.

FIELD

The present disclosure relates generally to electronics, and more specifically to bias circuits for amplifiers.

BACKGROUND

Wireless communication devices and technologies are becoming ever more prevalent, as are communication devices that operate at millimeter-wave (mmW) frequencies. Wireless communication devices generally transmit and/or receive communication signals. In a radio frequency (RF) transceiver, a communication signal is typically amplified and transmitted by a transmit section and a received communication signal is amplified and processed by a receive section. A receive section may comprise one or more circuits that amplify and process the communication signal. The amplifier circuit or circuits may comprise one or more amplifier paths having one or more stages that may include one or more low noise amplifier (LNA) circuits. One of the factors that determines how the LNA operates is a bias circuit. A bias circuit typically establishes the operating parameters of an amplifier. Accordingly, it is desirable to operate the bias circuit as efficiently as possible.

SUMMARY

Various implementations of systems, methods and devices within the scope of the appended claims each have several aspects, no single one of which is solely responsible for the desirable attributes described herein. Without limiting the scope of the appended claims, some prominent features are described herein.

Details of one or more implementations of the subject matter described in this specification are set forth in the accompanying drawings and the description below. Other features, aspects, and advantages will become apparent from the description, the drawings, and the claims. Note that the relative dimensions of the following figures may not be drawn to scale.

One aspect of the disclosure provides an amplifier circuit including an amplifier core having a cascode transistor and a gain transistor, a bias circuit coupled to the amplifier core, the bias circuit having a first current source, a second current source, an operational transconductance amplifier (OTA), a bias cascode transistor pair having a bias cascode transistor and a bias gain transistor and a replica circuit coupled to the first current source and to the second current source. The replica includes a first replica transistor coupled to the first current source, and a second replica transistor coupled to the second current source, a third replica transistor coupled to the second replica transistor, an adjustable resistance coupled to the first replica transistor, a voltage divider coupled to the second replica transistor and the third replica transistor, where a gate of the third replica transistor provides a bias voltage, Vgate, for the amplifier core.

Another aspect of the disclosure provides a method for biasing an amplifier, including generating a bias voltage using a first current loop and a second current loop, the first current loop comprising a plurality of current sources and a voltage divider, the second current loop comprising a single amplifier, and applying the bias voltage to an amplifier.

Another aspect of the disclosure provides a device including means for generating a bias voltage using a first current loop and a second current loop, the first current loop comprising a plurality of current sources and a voltage divider, the second current loop comprising a single amplifier, and means for applying the bias voltage to an amplifier.

BRIEF DESCRIPTION OF THE DRAWINGS

In the figures, like reference numerals refer to like parts throughout the various views unless otherwise indicated. For reference numerals with letter character designations such as "102a" or "102b", the letter character designations may differentiate two like parts or elements present in the same figure. Letter character designations for reference numerals may be omitted when it is intended that a reference numeral encompass all parts having the same reference numeral in all figures.

DETAILED DESCRIPTION

The word "exemplary" is used herein to mean "serving as an example, instance, or illustration." Any aspect described herein as "exemplary" is not necessarily to be construed as preferred or advantageous over other aspects.

In a communication device receiver, a low noise amplifier (LNA) may be biased by a circuit that includes transistors, which are typically implemented using a process technology referred to as metal-oxide semiconductor field effect transistor (MOSFET). A MOSFET may also be referred to as a FET and may also be a p-channel FET (PFET) or an n-channel FET (NFET). A complementary metal-oxide semiconductor (CMOS) circuit may include both NFETs and PFETs. Regardless of the implementation type, a PET device typically provides a gain which may also be referred to as the Gm of the device. The measurement of the linearity of a FET device used as a low noise amplifier (LNA) and the noise figure, or NF, of the device may be important characteristics.

A FET typically has three terminals, referred to as a gate, a source and a drain. Various voltages exist in a FET, a gate-source voltage is referred to as Vgs; a drain-source voltage is referred to as Vds; a drain voltage is referred to as Vd or Vdrain; and a gate voltage is referred to as Vg or Vgate.

An LNA using FETs may be implemented as a transconductance amplifier (also referred to as a Gm stage) using what is referred to as a cascode architecture, where the cascode architecture includes two transistors, one transistor operating as a common source and the other transistor operating as a common gate. One of the transistors (the gain transistor) receives the RF input signal at its gate, and the other transistor (the cascode transistor) provides the RF signal output at its drain.

In a low noise amplifier (LNA) that is implemented using FET devices the LNA bias current is dependent on the drain voltage, Vd, of the amplifier device that is providing the signal amplification (the Gm, or gain) of the LNA, that is, the gain transistor. Such a device may be fabricated having a short channel length, which may reduce the NF or increase the likelihood that a NF requirement is satisfied. The gate-source voltage, Vgs and the drain-source voltage, Vds, should be set correctly to control the bias current, the linearity, and/or the noise figure (NF) of the gain transistor of the LNA. The dependence on the drain voltage, Vd, of the gain transistor that is providing the signal amplification (the Gm, or gain) of the LNA becomes more significant at low bias current, which is typically used for lower gain modes (such as for the G4 mode, which is typically about 1 mA (milliAmp)).

Existing bias circuits use two current loops to bias the LNA. This provides good control over the LNA bias current, particularly with process, voltage and temperature (PVT) variations, and allows the gain (Gm) of the gain transistor to be set independently of the drain voltage, Vd. However, such a bias circuit may be implemented using two operational transconductance amplifiers (OTAs), which results in significant power consumption (particularly in lower gain modes), and consumes significant area on the circuit.

Therefore, it would be desirable to have a way of efficiently biasing an amplifier.

In an exemplary embodiment, a bias circuit for a low noise amplifier (LNA) provides the above-mentioned dual loop behavior, while using only a single OTA.

In an exemplary embodiment, a bias circuit for a low noise amplifier (LNA) may be implemented using a smaller circuit area and may consume less power due to being implemented using a single OTA.

Figure 1:
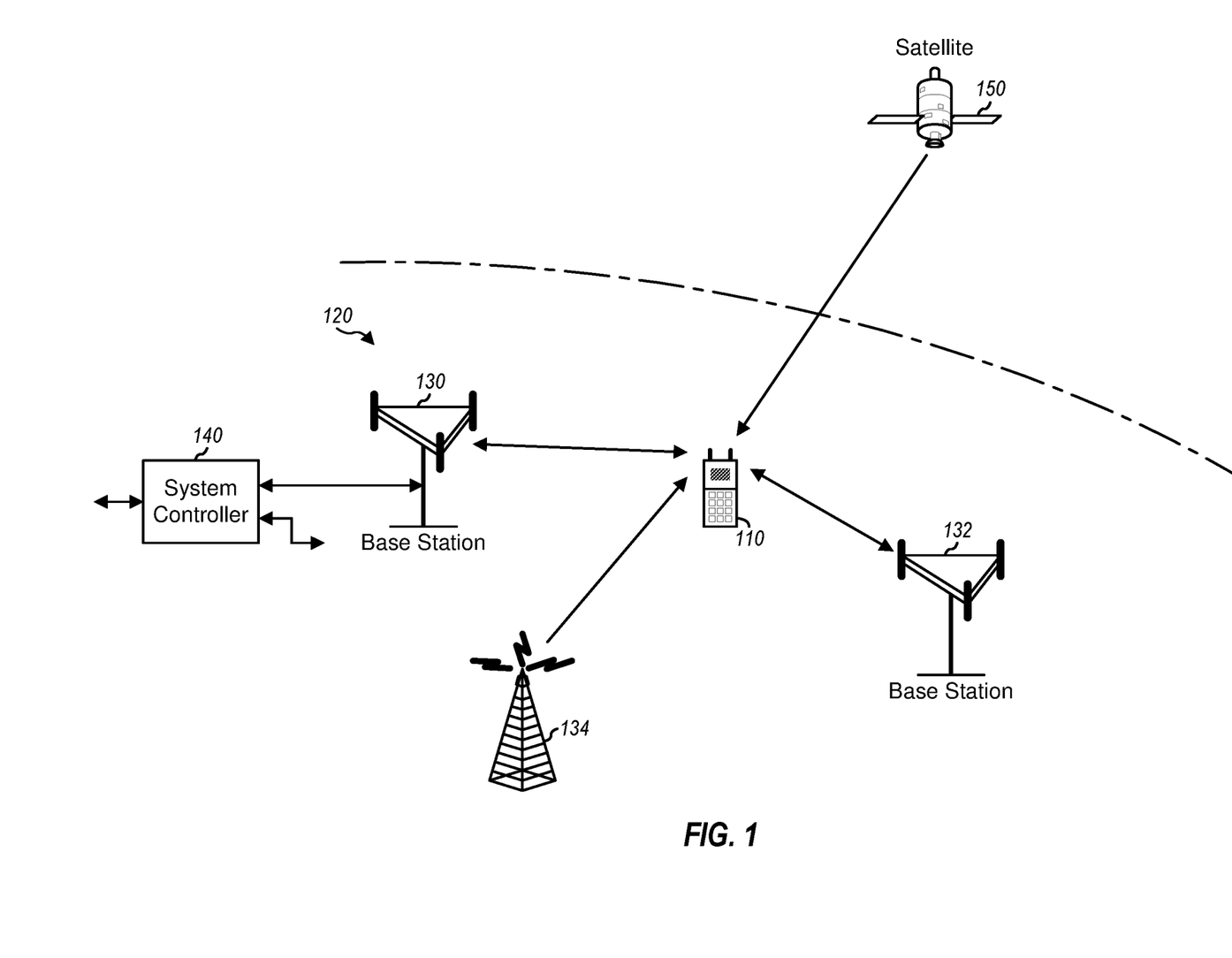
FIG. 1 is a diagram showing a wireless device communicating with a wireless communication system.

FIG. 1 is a diagram showing a wireless device 110 communicating with a wireless communication system 120. The wireless communication system 120 may be a Long Term Evolution (LTE) system, a Code Division Multiple Access (CDMA) system, a Global System for Mobile Communications (GSM) system, a wireless local area network (WLAN) system, a 5G NR (new radio) system, or some other wireless system. A CDMA system may implement Wideband CDMA (WCDMA), CDMA 1×, Evolution-Data Optimized (EVDO), Time Division Synchronous CDMA (TD-SCDMA), or some other version of CDMA. For simplicity, FIG. 1 shows wireless communication system 120 including two base stations 130 and 132 and one system controller 140. In general, a wireless communication system may include any number of base stations and any set of network entities.

The wireless device 110 may also be referred to as a user equipment (UE), a mobile station, a terminal, an access terminal, a subscriber unit, a station, etc. Wireless device 110 may be a cellular phone, a smartphone, a tablet, a wireless modem, a personal digital assistant (PDA), a handheld device, a laptop computer, a smartbook, a netbook, a tablet, a cordless phone, a medical device, an automobile, a device configured to connect to one or more other devices (for example through the internet of things), a wireless local loop (WLL) station, a Bluetooth device, etc. Wireless device 110 may communicate with wireless communication system 120. Wireless device 110 may also receive signals from broadcast stations (e.g., a broadcast station 134) and/or signals from satellites (e.g., a satellite 150 in one or more global navigation satellite systems (GNSS)), etc). Wireless device 110 may support one or more radio technologies for wireless communication such as LTE, WCDMA, CDMA 1×, EVDO, TD-SCDMA, GSM, 802.11, 802.15, 5G, UWB, etc.

Wireless device 110 may support carrier aggregation, for example as described in one or more LTE or 5G standards. In some embodiments, a single stream of data is transmitted over multiple carriers using carrier aggregation, for example as opposed to separate carriers being used for respective data streams. Wireless device 110 may be able to operate in a variety of communication bands including, for example, those communication bands used by LTE, WiFi, 5G or other communication bands, over a wide range of frequencies. Wireless device 110 may also be capable of communicating directly with other wireless devices without communicating through a network.

In general, carrier aggregation (CA) may be categorized into two types—intra-band CA and inter-band CA. Intra-band CA refers to operation on multiple carriers within the same band. Inter-band CA refers to operation on multiple carriers in different bands.

Figure 2A:
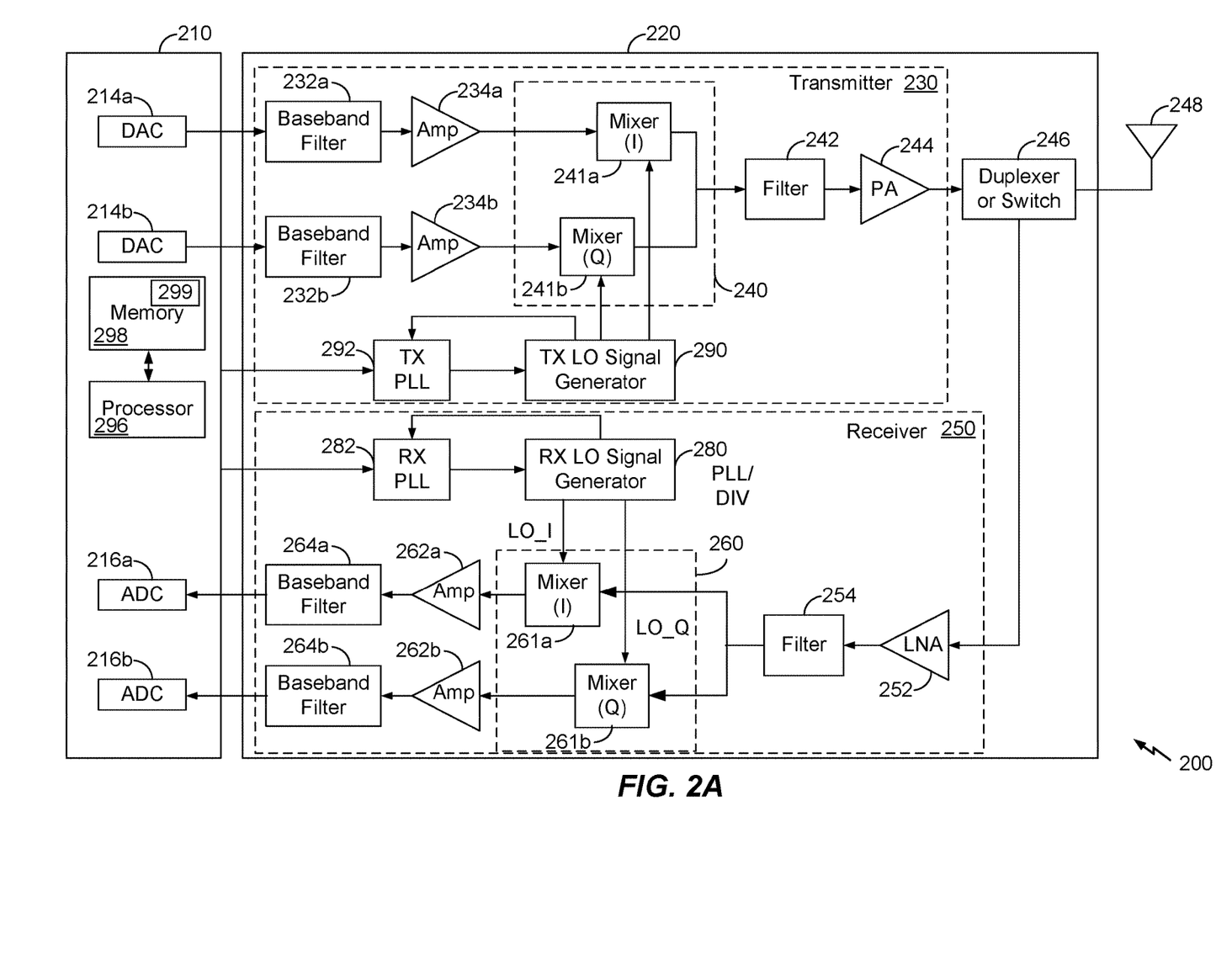
FIG. 2A is a block diagram showing a wireless device in which exemplary techniques of the present disclosure may be implemented.

FIG. 2A is a block diagram showing a wireless device 200 in which exemplary techniques of the present disclosure may be implemented. The wireless device 200 may, for example, be an embodiment of the wireless device 110 illustrated in FIG. 1.

FIG. 2A shows an example of a transceiver 220 having a transmitter 230 and a receiver 250. In general, the conditioning of the signals in the transmitter 230 and the receiver 250 may be performed by one or more stages of amplifier, filter, upconverter, downconverter, etc. These circuit blocks may be arranged differently from the configuration shown in FIG. 2A. Furthermore, other circuit blocks not shown in FIG. 2A may also be used to condition the signals in the transmitter 230 and receiver 250. Unless otherwise noted, any signal in FIG. 2A, or any other figure in the drawings, may be either single-ended or differential. Some circuit blocks in FIG. 2A may also be omitted.

In the example shown in FIG. 2A, wireless device 200 generally comprises the transceiver 220 and a data processor 210. The data processor 210 may include a processor 296 operatively coupled to a memory 298. The memory 298 may be configured to store data and program codes shown generally using reference numeral 299, and may generally comprise analog and/or digital processing components. The processor 296 and the memory 298 may cooperate to control, configure, program, or otherwise fully or partially control some or all of the operation of the embodiments of the system and method for biasing an amplifier described herein.

The transceiver 220 includes a transmitter 230 and a receiver 250 that support bi-directional communication. In general, wireless device 200 may include any number of transmitters and/or receivers for any number of communication systems and frequency bands. All or a portion of the transceiver 220 may be implemented on one or more analog integrated circuits (ICs), RF ICs (RFICs), mixed-signal ICs, etc.

A transmitter or a receiver may be implemented with a super-heterodyne architecture or a direct-conversion architecture. In the super-heterodyne architecture, a signal is frequency-converted between radio frequency (RF) and baseband in multiple stages, e.g., from RF to an intermediate frequency (IF) in one stage, and then from IF to baseband in another stage for a receiver. In the direct-conversion architecture, a signal is frequency converted between RF and baseband in one stage. The super-heterodyne and direct-conversion architectures may use different circuit blocks and/or have different requirements. In the example shown in FIG. 2A, transmitter 230 and receiver 250 are implemented with the direct-conversion architecture.

In the transmit path, the data processor 210 processes data to be transmitted and provides in-phase (I) and quadrature (Q) analog output signals to the transmitter 230. In an exemplary embodiment, the data processor 210 includes digital-to-analog-converters (DAC's) 214a and 214b for converting digital signals generated by the data processor 210 into the I and Q analog output signals, e.g., I and Q output currents, for further processing. In other embodiments, the DACs 214a and 214b are included in the transceiver 220 and the data processor 210 provides data (e.g., for I and Q) to the transceiver 220 digitally.

Within the transmitter 230, baseband (e.g., lowpass) filters 232a and 232b filter the I and Q analog transmit signals, respectively, to remove undesired images caused by the prior digital-to-analog conversion. Amplifiers (Amp) 234a and 234b amplify the signals from baseband filters 232a and 232b, respectively, and provide I and Q baseband signals. An upconverter 240 having upconversion mixers 241a and 241b upconverts the I and Q baseband signals with I and Q transmit (TX) local oscillator (LO) signals from a TX LO signal generator 290 and provides an upconverted signal. A filter 242 filters the upconverted signal to remove undesired images caused by the frequency upconversion as well as noise in a receive frequency band. A power amplifier (PA) 244 amplifies the signal from filter 242 to obtain the desired output power level and provides a transmit RF signal. The transmit RF signal may be routed through a duplexer or switch 246 and transmitted via an antenna 248. While examples discussed herein utilize I and Q signals, those of skill in the art will understand that components of the transceiver may be configured to utilize polar modulation.

In the receive path, antenna 248 receives communication signals and provides a received RF signal, which may be routed through duplexer or switch 246 and provided to a low noise amplifier (LNA) 252. The duplexer 246 is designed to operate with a specific RX-to-TX duplexer frequency separation, such that RX signals are isolated from TX signals. The received RF signal is amplified by LNA 252 and filtered by a filter 254 to obtain a desired RF input signal. Exemplary embodiments of the system and method for biasing an amplifier may be implemented in or as part of the LNA 252. In other embodiments, the system and method for biasing an amplifier may be implemented in other portions of the receiver 250, or in a transceiver, such as in a transceiver circuit, module or chip.

Downconversion mixers 261a and 261b in a downconverter 260 mix the output of filter 254 with I and Q receive (RX) LO signals (i.e., LO_I and LO_Q) from an RX LO signal generator 280 to generate I and Q baseband signals. The I and Q baseband signals are amplified by amplifiers 262a and 262b and further filtered by baseband (e.g., low- pass) filters 264a and 264b to obtain I and Q analog input signals, which are provided to data processor 210. In the exemplary embodiment shown, the data processor 210 includes analog-to-digital-converters (ADC's) 216a and 216b for converting the analog input signals into digital signals to be further processed by the data processor 210. In some embodiments, the ADCs 216a and 216b are included in the transceiver 220 and provide data to the data processor 210 digitally.

In FIG. 2A, TX LO signal generator 290 generates the I and Q TX LO signals used for frequency upconversion, while RX LO signal generator 280 generates the I and Q RX LO signals used for frequency downconversion. Each LO signal is a periodic signal with a particular fundamental frequency. A phase locked loop (PLL) 292 receives timing information from data processor 210 and generates a control signal used to adjust the frequency and/or phase of the TX LO signals from LO signal generator 290. Similarly, a PLL 282 receives timing information from data processor 210 and generates a control signal used to adjust the frequency and/or phase of the RX LO signals from LO signal generator 280.

Wireless device 200 may support CA and may (i) receive multiple downlink signals transmitted by one or more cells on multiple downlink carriers at different frequencies and/or (ii) transmit multiple uplink signals to one or more cells on multiple uplink carriers. Those of skill in the art will understand, however, that aspects described herein may be implemented in systems, devices, and/or architectures that do not support carrier aggregation.

Certain components of the transceiver 220 are functionally illustrated in FIG. 2A, and the configuration illustrated therein may or may not be representative of a physical device configuration in certain implementations. For example, as described above, transceiver 220 may be implemented in various integrated circuits (ICs), RF ICs (RFICs), mixed-signal ICs, etc. In some embodiments, the transceiver 220 is implemented on a substrate or board such as a printed circuit board (PCB) having various modules, chips, and/or components. For example, the power amplifier 244, the filter 242, and the duplexer 246 may be implemented in separate modules or as discrete components, while the remaining components illustrated in the transceiver 220 may be implemented in a single transceiver chip.

The power amplifier 244 may comprise one or more stages comprising, for example, driver stages, power amplifier stages, or other components, that can be configured to amplify a communication signal on one or more frequencies, in one or more frequency bands, and at one or more power levels. Depending on various factors, the power amplifier 244 can be configured to operate using one or more driver stages, one or more power amplifier stages, one or more impedance matching networks, and can be configured to provide good linearity, efficiency, or a combination of good linearity and efficiency.

In an exemplary embodiment in a super-heterodyne architecture, the PA 244 and LNA 252 (and filter 242 and filter 254 in some examples) may be implemented separately from other components in the transmitter 230 and receiver 250, for example on a millimeter wave integrated circuit. An example super-heterodyne architecture is illustrated in FIG. 2B.

Figure 2B:
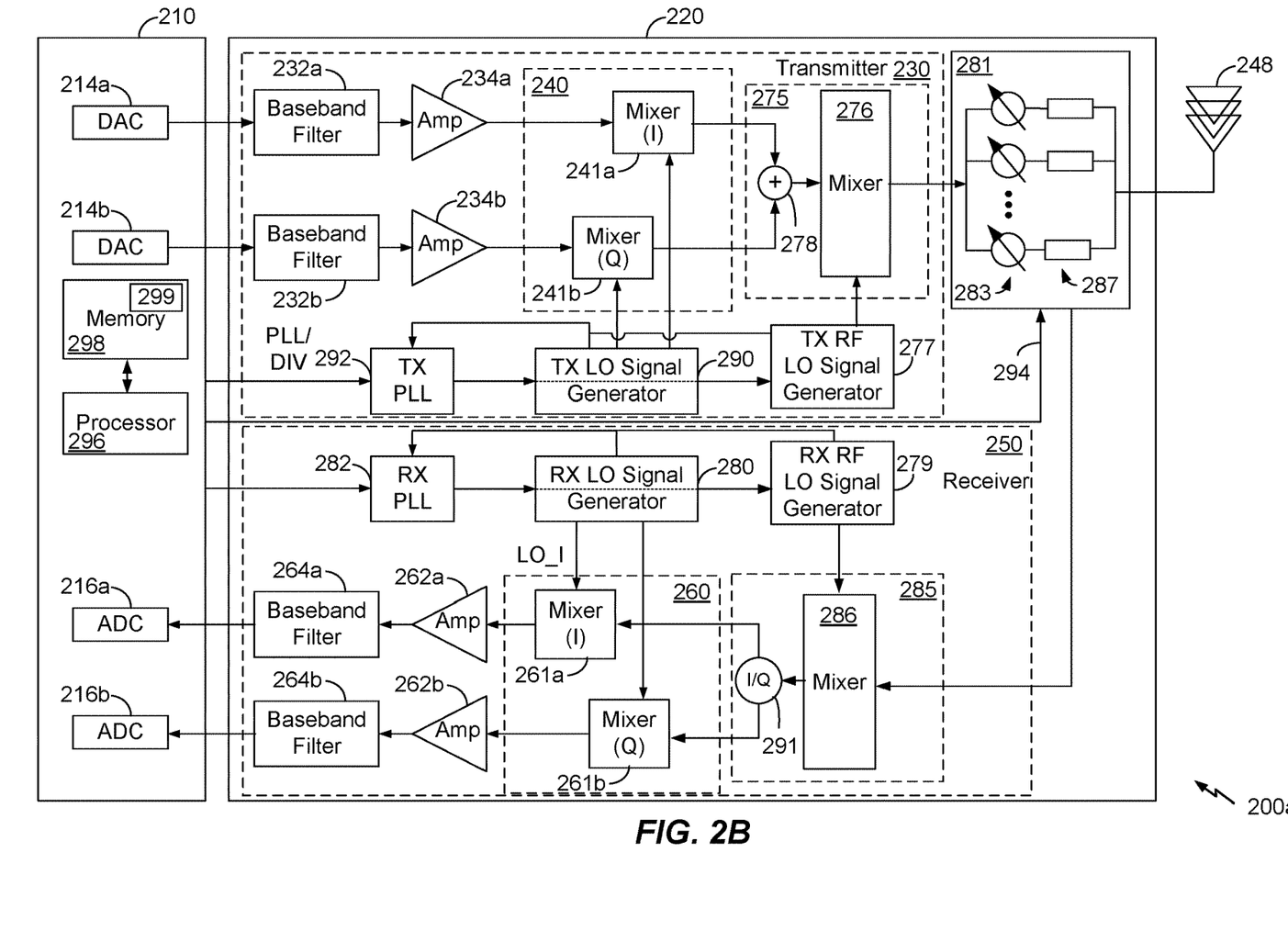
FIG. 2B is a block diagram showing a wireless device in which exemplary techniques of the present disclosure may be implemented.

FIG. 2B is a block diagram showing a wireless device in which exemplary techniques of the present disclosure may be implemented. Certain components, for example which may be indicated by identical reference numerals, of the wireless device 200a in FIG. 2B may be configured similarly to those in the wireless device 200 shown in FIG. 2A and the description of identically numbered items in FIG. 2B will not be repeated.

The wireless device 200a is an example of a heterodyne (or superheterodyne) architecture in which the upconverter 240 and the downconverter 260 are configured to process a communication signal between baseband and an intermediate frequency (IF). For example, the upconverter 240 may be configured to provide an IF signal to an upconverter 275. In an exemplary embodiment, the upconverter 275 may comprise summing function 278 and upconversion mixer 276. The summing function 278 combines the I and the Q outputs of the upconverter 240 and provides a non-quadrature signal to the mixer 276. The non-quadrature signal may be single ended or differential. The mixer 276 is configured to receive the IF signal from the upconverter 240 and TX RF LO signals from a TX RF LO signal generator 277, and provide an upconverted RF signal to phase shift circuitry 281. While PLL 292 is illustrated in FIG. 2B as being shared by the signal generators 290, 277, a respective PLL for each signal generator may be implemented.

In an exemplary embodiment, components in the phase shift circuitry 281 may comprise one or more adjustable or variable phased array elements, and may receive one or more control signals from the data processor 210 over connection 294 and operate the adjustable or variable phased array elements based on the received control signals.

In an exemplary embodiment, the phase shift circuitry 281 comprises phase shifters 283 and phased array elements 287. Although three phase shifters 283 and three phased array elements 287 are shown for ease of illustration, the phase shift circuitry 281 may comprise more or fewer phase shifters 283 and phased array elements 287.

Each phase shifter 283 may be configured to receive the RF transmit signal from the upconverter 275, alter the phase by an amount, and provide the RF signal to a respective phased array element 287. Each phased array element 287 may comprise transmit and receive circuitry including one or more filters, amplifiers, driver amplifiers, and/or power amplifiers. In some embodiments, the phase shifters 283 may be incorporated within respective phased array elements 287.

The output of the phase shift circuitry 281 is provided to an antenna array 248. In an exemplary embodiment, the antenna array 248 comprises a number of antennas that typically correspond to the number of phase shifters 283 and phased array elements 287, for example such that each antenna element is coupled to a respective phased array element 287. In an exemplary embodiment, the phase shift circuitry 281 and the antenna array 248 may be referred to as a phased array.

In a receive direction, an output of the phase shift circuitry 281 is provided to a downconverter 285. In an exemplary embodiment, the downconverter 285 may comprise an I/Q generation function 291 and a downconversion mixer 286. In an exemplary embodiment, the mixer 286 downconverts the receive RF signal provided by the phase shift circuitry 281 to an IF signal according to RX RF LO signals provided by an RX RF LO signal generator 279. The I/Q generation function 291 receives the IF signal from the mixer 286 and generates I and Q signals for the downconverter 260, which downconverts the IF signals to baseband, as described above. While PLL 282 is illustrated in FIG. 2B as being shared by the signal generators 280, 279, a respective PLL for each signal generator may be implemented.

In some embodiments, the upconverter 275, downconverter 285, and the phase shift circuitry 281 are implemented on a common IC. In some embodiments, the summing function 278 and the I/Q generation function 291 are implemented separate from the mixers 276 and 286 such that the mixers 276, 286 and the phase shift circuitry 281 are implemented on the common IC, but the summing function 278 and I/Q generation function 291 are not (e.g., the summing function 278 and I/Q generation function 291 are implemented in another IC coupled to the IC having the mixers 276, 286). In some embodiments, the LO signal generators 277, 279 are included in the common IC. In some embodiments in which phase shift circuitry is implemented on a common IC with 276, 286, 277, 278, 279, and/or 291, the common IC and the antenna array 248 are included in a module, which may be coupled to other components of the transceiver 220 via a connector. In some embodiments, the phase shift circuitry 281, for example, a chip on which the phase shift circuitry 281 is implemented, is coupled to the antenna array 248 by an interconnect. For example, components of the antenna array 248 may be implemented on a substrate and coupled to an integrated circuit implementing the phase shift circuitry 281 via a flexible printed circuit.

In some embodiments, both the architecture illustrated in FIG. 2A and the architecture illustrated in FIG. 2B are implemented in the same device. For example, a wireless device 110 or 200 may be configured to communicate with signals having a frequency below about 20 GHz using the architecture illustrated in FIG. 2A and to communicate with signals having a frequency above about 20 GHz using the architecture illustrated in FIG. 2B. In devices in which both architectures are implemented, one or more components of FIGS. 2A and 2B that are identically numbered may be shared between the two architectures. For example, both signals that have been downconverted directly to baseband from RF and signals that have been downconverted from RF to baseband via an IF stage may be filtered by the same baseband filter 264. In other embodiments, a first version of the filter 264 is included in the portion of the device which implements the architecture of FIG. 2A and a second version of the filter 264 is included in the portion of the device which implements the architecture of FIG. 2B. While certain example frequencies are described herein, other implementations are possible. For example, signals having a frequency above about 20 GHz (e.g., having a mmW frequency) may be transmitted and/or received using a direct conversion architecture. In such embodiments, for example, a phased array may be implemented in the direct conversion architecture.

Figure 3:
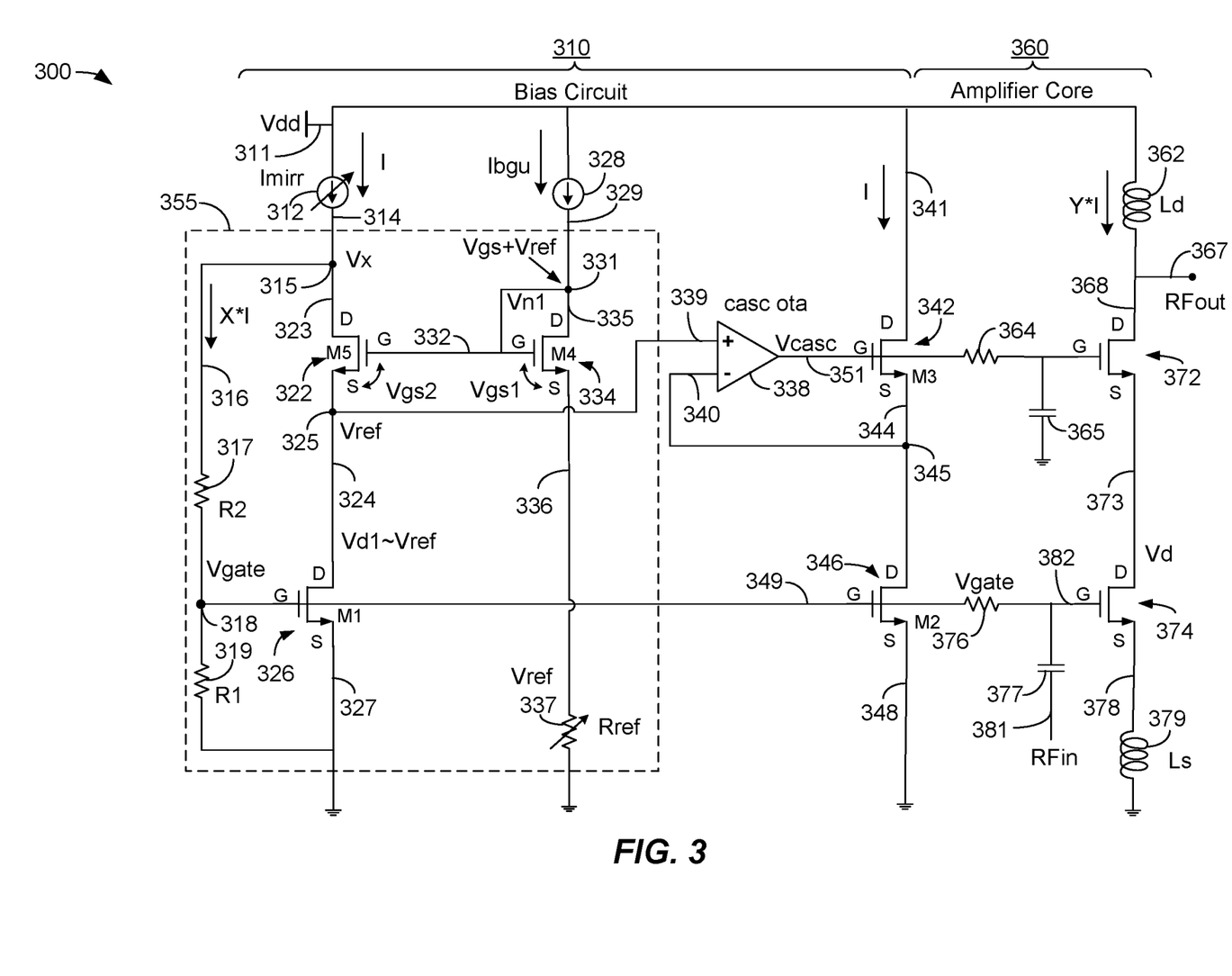
FIG. 3 is a block diagram of an amplifier circuit in accordance with an exemplary embodiment of the disclosure.

FIG. 3 is a block diagram of an amplifier circuit 300 in accordance with an exemplary embodiment of the disclosure. In an exemplary embodiment, the amplifier circuit 300 includes a bias circuit 310 and an amplifier core 360. In some examples, the amplifier circuit 300 is configured as a low noise amplifier (LNA) and the amplifier core 360 comprises an LNA core. For example, the amplifier 300 may be an example of the LNA 252, or of an LNA in one or more of the phased array elements 287. In some such examples, the LNA is included in a front end module coupled to a transceiver of the wireless device 110 and/or includes short channel length devices. In other examples, the amplifier 300 may be configured as another type of amplifier, for example any of the other amplifiers described above and/or illustrated in FIG. 2, and may be included in a transceiver, in a front end module, in an RFIC, as a discrete component on a circuit board, etc.

In an exemplary embodiment, the bias circuit 310 includes a current source 312, a current source 328 and a connection 341, all coupled to a system voltage, Vdd, at a node 311. In an exemplary embodiment, the system voltage, Vdd, may be approximately 1.2V, or may be another voltage. In an exemplary embodiment, the current source 312 may be an adjustable or variable current source configured to provide an adjustable current across different gain modes. In an exemplary embodiment, the current source 312 may receive a control signal from the data processor 210 of FIG. 2A or FIG. 2B.

In an exemplary embodiment, the bias circuit 310 also includes a transistor 322, a transistor 334, a transistor 326, an operational transconductance amplifier (OTA) 338, a transistor 342 a transistor 346, a voltage divider (illustrated herein as a resistive voltage divider including resistance 317 and resistance 319) and a variable resistance 337. In an exemplary embodiment, the variable resistance 337 may receive a control signal from the data processor 210 of FIG. 2A or FIG. 2B.

The current source 312 is coupled to a node 315 over connection 314. A drain of the transistor 322 is coupled to the node 315 over connection 323. A source of the transistor 322 is coupled to a node 325, and a gate of the transistor 322 is coupled to a gate of the transistor 334 over connection 332. The node 315 may be coupled to an input of the voltage divider. While the voltage divider is configured as a resistive voltage divider in the example illustrated in FIG. 3, other types of voltage dividers may be used.

The current source 328 is coupled to a node 331 over connection 329. A drain of the transistor 334 is coupled to the node 331 over connection 335. A source of the transistor 334 is coupled to the variable resistance 337 over connection 336. A gate of the transistor 334 and the gate of the transistor 322 are also coupled to the node 331.

A drain of the transistor 326 is coupled to the node 325 over connection 324. A source of the transistor 326 is coupled to system ground over connection 327. A gate of the transistor 326 is coupled to a node 318, which may comprise or be coupled to an output of the voltage divider. In the resistive voltage divider illustrated in FIG. 3, the resistance 317 is coupled between the node 315 and the node 318. The resistance 319 is coupled between the node 318 and system ground.

A drain of the transistor 342 is coupled to the system voltage, Vdd, over connection 341, a source of the transistor 342 is coupled to a node 345 and a gate of the transistor 342 coupled to an output of the OTA 338 over connection 351.

A drain of the transistor 346 is coupled to the source of the transistor 342 over connection 347 at the node 345, a source of the transistor 346 is coupled to system ground over connection 348, and a gate of the transistor 346 is coupled to the node 318 over connection 349.

The OTA 338 has a non-inverting input coupled to the node 325 over connection 339 and an inverting input coupled to the node 345 over connection 340. A voltage at the node 325 may be referred to as Vd1 (the voltage at the drain of the transistor 326), which also closely approximates a reference voltage, Vref, at the non-inverting input to the OTA 338.

A gate-source voltage, Vgs1, refers to the gate-source voltage of the transistor 334 and a gate-source voltage, Vgs2, refers to the gate-source voltage of the transistor 322. A voltage equal to Vgs+Vref appears at the node 331. The voltage, Vgs, at node 331 refers to the gate-source voltage of the transistor 334 and the voltage, Vn1, is the sum of Vgs of the transistor 334 and the voltage, Vref, across the variable resistance 337. A voltage, Vx, appears at the node 315.

The amplifier core 360 includes an optional inductance 362, a transistor 372, a transistor 374, an optional inductance 379, a resistance 364, a capacitance 365, a resistance 376 and a capacitance 377. One side of the inductance 362 is coupled to the system voltage, Vdd, at node 311. A drain of the transistor 372 is coupled to the other side of the inductance 362 over connection 368. A source of the transistor 372 is coupled to a drain of the transistor 374 over connection 373, and a gate of the transistor 372 is coupled to the resistance 364. The other side of the resistance 364 is coupled to the gate of the transistor 342 and to the output of the OTA 338. The gate of the transistor 372 is also coupled to the capacitance 365.

A source of the transistor 374 is coupled to one side of the inductance 379 over connection 378. The other side of the inductance 379 is coupled to system ground. The inductance 379 may be referred to as a source degeneration inductance. A gate of the transistor 374 is coupled to the resistance 376 and to the capacitance 377. The other side of the resistance 376 is coupled to the gate of the transistor 346 and also to the node 318 over connection 349. A radio frequency (RF) input signal (RFin) is provided to the amplifier core 360 at connection 381 and an RF output signal, RFout, is provided from the drain of the transistor 372 over connection 367.

The transistor 374 may be fabricated as a short channel length device having a close dependency between gate voltage and drain voltage.

The arrangement of the transistors 342 and 346, and the transistors 372 and 374 is referred to as a cascode arrangement. The transistors 342 and 372 are the cascode transistors and the transistors 346 and 374 are the gain transistors.

In an exemplary embodiment, the OTA 338 generates a voltage, Vcasc, which is provided to the gate of the transistor 342 and to the gate of the transistor 372 through the resistance 364.

In an exemplary embodiment, the transistors 326, 346 and 342 may have a size referred to as (W/L). The transistor 334 has a size that is referred to as (W1/L1), the transistor 322 has a size that is referred to as N1*(W1/L1), and the transistors 372 and 374 have a size that is referred to as N*(W/L).

The transistors 322, 326, 334, 342, 346, 372 and 374 are depicted as N-type metal oxide semiconductor (NMOS) transistors; however, they may also be implemented using P-type devices.

In an exemplary embodiment, the current source 328 generates and flows a current, Ibgu, and the current source 312 generates and flows a current that mirrors the current Ibgu, and is referred to as a current, Imirror. A current, I, flows through the connection 314 and through the connection 341. The current, I, through the current source 312 is used to bias the transistor 374 and is typically higher than the current, Ibgu, generated by the current source 328.

In an exemplary embodiment, the transistor 322, the transistor 334, the transistor 326, the voltage divider (e.g., the resistance 317 and the resistance 319) and the variable resistance 337 may comprise a replica circuit 355 configured to develop the reference voltage, Vref that is provided to the non-inverting input of the OTA 338.

A current (e.g., X*I) that is a fraction of the current, I, flows through connection 316. In an exemplary embodiment, X is less than one half or one fifth (e.g., X is 0.2, or 0.15, or less), and the current that flows through the connection 316 may be 0.1*I.

In an exemplary embodiment, the resistances 317 and 319 form what is referred to as a resistive feedback structure using the fraction of the current, I, while maintaining a drain voltage at the transistor 326 as a reference voltage, Vref, using a replica bias voltage, Vgate=(R1/R1+R2)*Vx (the voltage at node 315). The gate voltage, Vgate, appears at the node 318 and is also provided to the gate of the transistor 346 and to the gate of the transistor 374 through the resistance 376.

In an exemplary embodiment, the value of the resistance 317 may be 1.5× the value of the resistance 319.

The voltage Vn1=Vref+Vgs1.

The voltage Vd1=Vn1+Vgs2.

The voltage Vgs1 can be made to approximate the voltage Vgs2 by sizing the transistor 334 as (W1/L1) and the transistor 322 as N1*(W1/L1), causing the voltage Vd1 to approximate the voltage Vref.

The voltage, Vcasc, is generated using the voltage Vref at node 325, thus making the drain voltage of the transistor 374 (the gain device of the amplifier) approximate to Vref.

A current (e.g., Y*I) that is a multiple of the current, I, flows through inductor 362 and connection 368. In an exemplary embodiment, Y is determined by a size of the transistor(s) 372 and/or 374 as compared to a size of other transistors in the amplifier circuit 300, for example the transistor(s) 342 and/or 346. In the example described above where the transistors 326, 346, and 342 have a size referred to as (W/L), and the transistors 372 and 374 have a size that is referred to as N*(W/L), Y may equivalent to N such that the current that flows through the inductor 362 and/or the connection 368 is N*I.

In an exemplary embodiment, the replica circuit 355 may be used to replace a second OTA that would otherwise be used to generate the voltage Vref and the gate voltage, Vgate. In this manner, current consumption and circuit area are reduced.

In an exemplary embodiment, the current source 312, current source 328, and the components in the replica circuit 355 may form a first loop, or first current loop, configured to bias the transistor 374 without an OTA. In an exemplary embodiment, the OTA 338, transistor 342 and transistor 346 may form a second loop, or second current loop, configured to bias the transistor 372. In an exemplary embodiment, the current source 312, current source 328, and the components in the replica circuit 355 in the first current loop generate a first bias current for the amplifier core 360 that is proportional to a gain of the gain transistor, such as one or both of the transistors 346 and 374.

Figure 4:
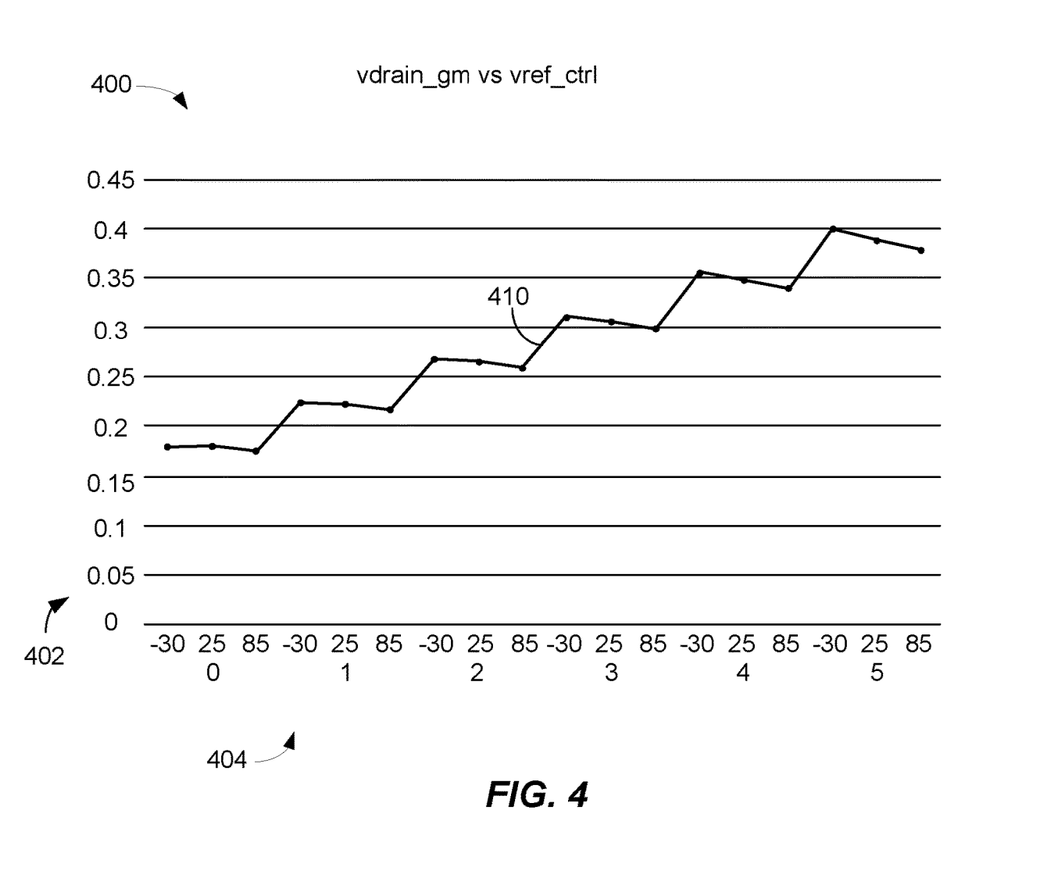
FIG. 4 is a graph having a trace showing the drain voltage, Vd, of an LNA gain transistor as a function of Vref and temperature.

FIG. 4 is a graph 400 having a trace 410 showing the drain voltage, Vd, of an LNA gain transistor as a function of Vref and temperature. The vertical axis 402 shows drain voltage, Vd, of a gain transistor, such as the transistor 374 of FIG. 3, and the horizontal axis 404 shows control voltage, Vref, and temperature.

In an exemplary embodiment, the current, Imirror, (FIG. 3) may have a proportional to absolute temperature (PTAT) characteristic, and the drain voltage, Vd, of the gain transistor, such as the transistor 374 of FIG. 3, may have a complementary to absolute temperature (CTAT) slope across temperature, which improves linearity at higher gain modes. The trace 410 shows the drain voltage, Vd, of the transistor 374 for different values of Vref, across the variable resistance 337. The nomenclature "−30 25 85" refer to temperature in degrees Celsius. The trace 410 illustrates a CTAT behavior of the drain voltage, Vd, of the transistor 374, thus improving linearity at higher temperature.

Figure 5:
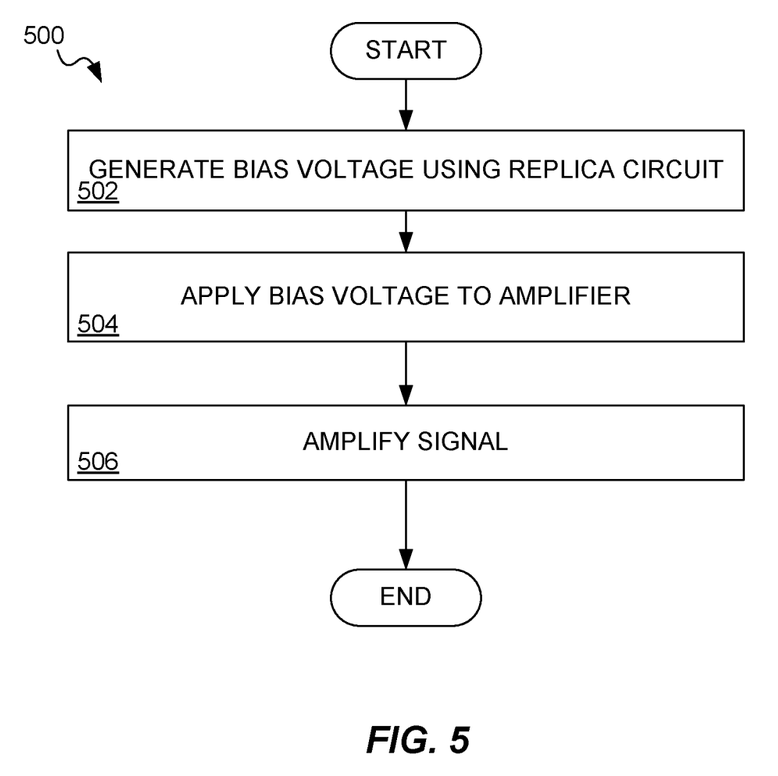
FIG. 5 is a flow chart describing an example of the operation of a method for biasing an amplifier.

FIG. 5 is a flow chart 500 describing an example of the operation of a method for biasing an amplifier. The blocks in the method 500 can be performed in or out of the order shown, and in some embodiments, can be performed at least in part in parallel.

In block 502, a bias voltage is generated. For example, the replica circuit 355 may generate a reference voltage, Vref, to provide a reference for the OTA 338 and a voltage, Vgate, may be generated at node 318. The gate voltage, Vgate may be used to bias an amplifier.

In block 504, the bias voltage is applied to an amplifier. For example, the gate voltage, Vgate, is provided to the transistor 374 as a bias signal. The bias signal, Vgate, may be provided to the transistor 374 through a resistance 376, and may be used to bias the transistor 374. In an exemplary embodiment, a drain voltage, Vd, of the transistor 374, is dependent on the bias voltage, Vgate.

In block 506, a signal may be amplified. For example, the transistor 374 (to which the bias signal, Vgate, is applied) and/or the transistor 372 (e.g., a cascode transistor) may amplify a signal provided at connection 381.

Figure 6:
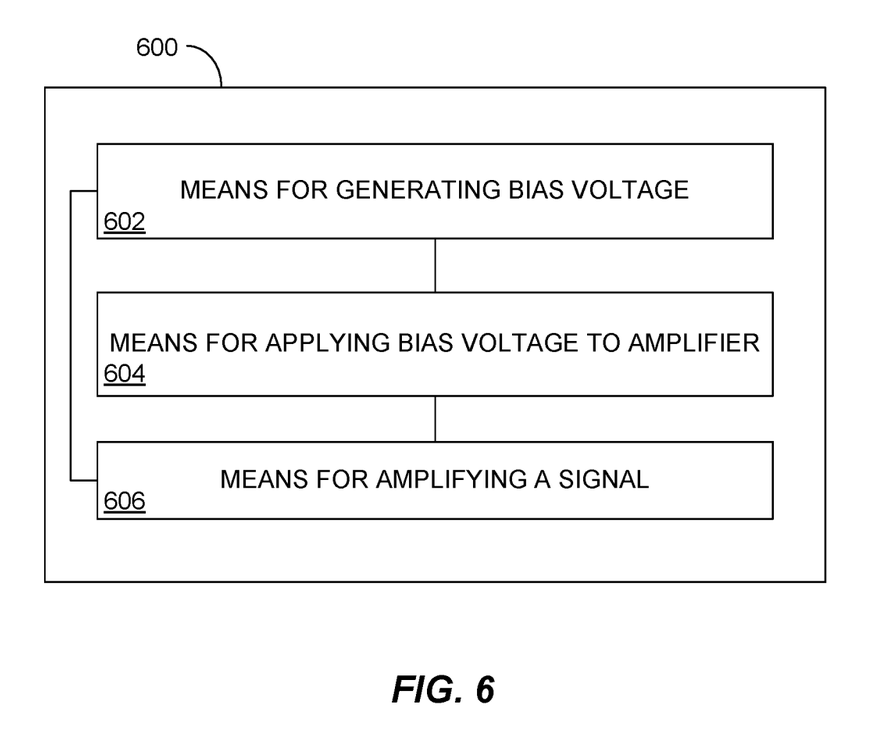
FIG. 6 is a functional block diagram of an apparatus for biasing an amplifier.

FIG. 6 is a functional block diagram of an apparatus for biasing an amplifier (or other means for amplifying). The apparatus 600 comprises means 602 for generating a bias voltage. In certain embodiments, the means 602 for generating a bias voltage can be configured to perform one or more of the functions described in operation block 502 of method 500 (FIG. 5). In an exemplary embodiment, the means 602 for generating a bias voltage may comprise the replica circuit 355, for example configured to generate a reference voltage, Vref, to provide a reference for the OTA 338 and generate a voltage, Vgate, at node 318. The gate voltage, Vgate may be used to bias an amplifier.

The apparatus 600 may also comprise means 604 for applying a bias voltage to an amplifier (or the other means for amplifying). In certain embodiments, the means 604 for applying a bias voltage to an amplifier can be configured to perform one or more of the functions described in operation block 504 of method 500 (FIG. 5). In an exemplary embodiment, the means 604 for applying a bias voltage to an amplifier may comprise the resistor 376, for example configured to provide the gate voltage, Vgate, to the transistor 374 as a bias signal.

The apparatus 600 may also include means 606 for amplifying or the amplifier referenced above in the description of the means 602 and 604. For example, the means for amplifying may include the transistor 374 (to which the bias signal, Vgate, is applied) and/or the transistor 372 (e.g., a cascode transistor).

Implementation examples are described in the following numbered clauses:

1. An amplifier circuit, comprising an amplifier core having a cascode transistor and a gain transistor; a bias circuit coupled to the amplifier core, the bias circuit comprising: a first current source; a second current source; an operational transconductance amplifier (OTA); a bias cascode transistor pair having a bias cascode transistor and a bias gain transistor; and a replica circuit coupled to the first current source and to the second current source, the replica circuit comprising: a first replica transistor coupled to the first current source, and a second replica transistor coupled to the second current source; a third replica transistor coupled to the second replica transistor; an adjustable resistance coupled to the first replica transistor; a voltage divider coupled to the second replica transistor and the third replica transistor, wherein a gate of the third replica transistor is configured to provide a bias voltage, Vgate, for the amplifier core.

2. The amplifier circuit of clause 1, wherein the voltage divider comprises a first resistance and a second resistance, the gate of the third replica transistor coupled to a first node between the first resistance and the second resistance.

3. The amplifier circuit of clause 2, wherein the first resistance is coupled between the first node and a system ground.

4. The amplifier circuit of clause 2, wherein the second resistance is coupled between the first node and a drain of the second replica transistor.

5. The amplifier circuit of any of clauses 1 through 4, wherein the first replica transistor has a size (W1/L1) and the second replica transistor has a size N1*(W1/L1).

6. The amplifier circuit of any of clauses 1 through 5, wherein the third replica transistor has a size (W/L).

7. The amplifier circuit of any of clauses 1 through 6, wherein a second node is formed between a source of the second replica transistor and a drain of the third replica transistor.

8. The amplifier circuit of clause 7, wherein the OTA has a non-inverting input coupled to the second node, an inverting input coupled to a third node formed between a source of the bias cascode transistor and a drain of the bias gain transistor.

9. The amplifier circuit of any of clauses 1 through 8, wherein an output of the OTA is a cascode bias signal applied to a gate of the bias cascode transistor and a gate of the cascode transistor.

10. The amplifier circuit of any of clauses 1 through 9, wherein the amplifier core is a low noise amplifier (LNA) core.

11. The amplifier circuit of any of clauses 1 through 10, wherein the first replica circuit comprises a first current loop; and the OTA comprises a second current loop.

12. The amplifier circuit of clause 11, wherein the first replica circuit is configured to generate a first bias current without an operational amplifier.

13. The amplifier circuit of clause 11, wherein the first current loop generates a first bias current for the amplifier core that is proportional to a gain of the gain transistor.

14. The amplifier circuit of any of clauses 1 through 13, wherein the voltage divider comprises a resistive feedback structure.

15. A method for biasing an amplifier, comprising: generating a bias voltage using a first current loop and a second current loop, the first current loop comprising a plurality of current sources and a voltage divider, the second current loop comprising a single amplifier; and applying the bias voltage to an amplifier.

16. The method of clause 15, wherein generating the bias voltage further comprises: generating a bandgap current; generating a mirror current; generating a fraction of the mirror current; and dividing the mirror current to provide the bias voltage at a first node.

17. The method of clause 16, further comprising generating a reference voltage at a second node, the reference voltage associated with the bandgap current.

18. The method of clause 17, further comprising generating a cascode voltage based on the reference voltage.

19. The method of any of clauses 17 or 18, wherein the reference voltage is applied to the single amplifier in the second current loop.

20. The method of any of clauses 15 through 19, wherein the amplifier is a low noise amplifier (LNA).

21. The method of clause 16, further comprising generating the bias voltage at the first node without an operational amplifier.

22. The method of clause 20, wherein the bias voltage is proportional to a gain of a gain transistor in the LNA.

23. A device, comprising: means for generating a bias voltage using a first current loop and a second current loop, the first current loop comprising a plurality of current sources and a voltage divider, the second current loop comprising a single amplifier; and means for applying the bias voltage to an amplifier.

24. The device of clause 23, wherein the means for generating the bias voltage further comprises: means for generating a bandgap current; means for generating a mirror current; means for generating a fraction of the mirror current; and means for dividing the mirror current to provide the bias voltage at a first node.

25. The device of clause 24, further comprising means for generating a reference voltage at a second node, the reference voltage associated with the bandgap current.

26. The device of clause 25, further comprising means for generating a cascode voltage based on the reference voltage.

27. The device of any of clauses 23 through 26, wherein the amplifier is a low noise amplifier (LNA).

28. The device of clause 24, further comprising means for generating the bias voltage at the first node without an amplifier.

29. The device of clause 27, wherein the bias voltage is proportional to a gain of a gain transistor in the LNA.

The circuit architecture described herein described herein may be implemented on one or more ICs, analog ICs, RFICs, mixed-signal ICs, ASICs, printed circuit boards (PCBs), electronic devices, etc. The circuit architecture described herein may also be fabricated with various IC process technologies such as complementary metal oxide semiconductor (CMOS), N-channel MOS (NMOS), P-channel MOS (PMOS), bipolar junction transistor (BJT), bipolar-CMOS (BiCMOS), silicon germanium (SiGe), gallium arsenide (GaAs), heterojunction bipolar transistors (HBTs), high electron mobility transistors (HEMTs), silicon-on-insulator (SOI), etc.

An apparatus implementing the circuit described herein may be a stand-alone device or may be part of a larger device. A device may be (i) a stand-alone IC, (ii) a set of one or more ICs that may include memory ICs for storing data and/or instructions, (iii) an RFIC such as an RF receiver (RFR) or an RF transmitter/receiver (RTR), (iv) an ASIC such as a mobile station modem (MSM), (v) a module that may be embedded within other devices, (vi) a receiver, cellular phone, wireless device, handset, or mobile unit, (vii) etc.

Although selected aspects have been illustrated and described in detail, it will be understood that various substitutions and alterations may be made therein without departing from the spirit and scope of the present invention, as defined by the following claims.

What is claimed is:

1. An amplifier circuit, comprising:
   an amplifier core having a cascode transistor and a gain transistor;
   a bias circuit coupled to the amplifier core, the bias circuit comprising:
   a first current source;
   a second current source;
   an operational transconductance amplifier (OTA);
   a bias cascode transistor pair having a bias cascode transistor and a bias gain transistor; and
   a replica circuit coupled to the first current source and to the second current source, the replica circuit comprising:

a first replica transistor coupled to the first current source, and a second replica transistor coupled to the second current source;
a third replica transistor coupled to the second replica transistor;
an adjustable resistance coupled to the first replica transistor;
a voltage divider coupled to the second replica transistor and the third replica transistor, wherein an output of the voltage divider is coupled to a gate of the third replica transistor to provide a bias voltage, Vgate, for the amplifier core.

2. The amplifier circuit of claim 1, wherein the voltage divider comprises a first resistance and a second resistance, the gate of the third replica transistor coupled to a first node between the first resistance and the second resistance.

3. The amplifier circuit of claim 2, wherein the first resistance is coupled between the first node and a system ground.

4. The amplifier circuit of claim 2, wherein the second resistance is coupled between the first node and a drain of the second replica transistor.

5. The amplifier circuit of claim 1, wherein the first replica transistor has a size (W1/L1) and the second replica transistor has a size N1*(W1/L1).

6. The amplifier circuit of claim 5, wherein the third replica transistor has a size (W/L).

7. The amplifier circuit of claim 1, wherein a second node is formed between a source of the second replica transistor and a drain of the third replica transistor.

8. The amplifier circuit of claim 7, wherein the OTA has a non-inverting input coupled to the second node, an inverting input coupled to a third node formed between a source of the bias cascode transistor and a drain of the bias gain transistor.

9. The amplifier circuit of claim 8, wherein an output of the OTA is a cascode bias signal applied to a gate of the bias cascode transistor and a gate of the cascode transistor.

10. The amplifier circuit of claim 1, wherein the amplifier core is a low noise amplifier (LNA) core.

11. The amplifier circuit of claim 1, wherein:
the replica circuit comprises a first current loop; and
the OTA comprises a second current loop.

12. The amplifier circuit of claim 11, wherein the replica circuit is configured to generate a first bias current without an operational amplifier.

13. The amplifier circuit of claim 11, wherein the first current loop generates a first bias current for the amplifier core that is proportional to a gain of the gain transistor.

14. The amplifier circuit of claim 1, wherein the voltage divider comprises a resistive feedback structure.

* * * * *